(12) United States Patent
Cheng et al.

(10) Patent No.: US 9,466,672 B1
(45) Date of Patent: Oct. 11, 2016

(54) REDUCED DEFECT DENSITIES IN GRADED BUFFER LAYERS BY TENSILE STRAINED INTERLAYERS

(71) Applicant: International Business Machines Corporation, Armonk, NY (US)

(72) Inventors: Kangguo Cheng, Schenectady, NY (US); Keith E. Fogel, Hopewell Junction, NY (US); Pouya Hashemi, White Plains, NY (US); John A. Ott, Greenwood Lake, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/951,908

(22) Filed: Nov. 25, 2015

(51) Int. Cl.
*H01L 21/02* (2006.01)
*H01L 29/16* (2006.01)
*H01L 29/10* (2006.01)

(52) U.S. Cl.
CPC ..... *H01L 29/1054* (2013.01); *H01L 21/02532* (2013.01); *H01L 29/16* (2013.01)

(58) Field of Classification Search
None
See application file for complete search history.

(56) References Cited

U.S. PATENT DOCUMENTS

| | | | |
|---|---|---|---|
| 6,787,793 B2 | 9/2004 | Yoshida | |
| 6,921,914 B2 | 7/2005 | Cheng et al. | |
| 6,936,869 B2 | 8/2005 | Webb et al. | |
| 7,187,059 B2 | 3/2007 | Chan et al. | |
| 7,902,046 B2 | 3/2011 | Kuo et al. | |
| 7,943,969 B2 | 5/2011 | Yang et al. | |
| 8,232,191 B2 | 7/2012 | Fukuda et al. | |
| 8,796,081 B2 | 8/2014 | Wang et al. | |
| 2002/0017644 A1* | 2/2002 | Fitzgerald | H01L 21/82341 257/69 |
| 2004/0161947 A1* | 8/2004 | Fitzgard | H01L 21/02381 438/778 |
| 2006/0134893 A1* | 6/2006 | Savage | H01L 21/6835 438/483 |
| 2012/0025279 A1 | 2/2012 | Wang et al. | |
| 2013/0056053 A1* | 3/2013 | Lochtefeld | H01L 31/0687 136/255 |

FOREIGN PATENT DOCUMENTS

| | | |
|---|---|---|
| CN | 102054871 A1 | 5/2011 |
| CN | 102148250 A | 8/2011 |
| JP | 3967695 B2 | 8/2007 |

* cited by examiner

*Primary Examiner* — Khaja Ahmad
(74) *Attorney, Agent, or Firm* — Cantor Colburn LLP; Jennifer Anda

(57) ABSTRACT

A semiconductor stack includes a substrate; a first semiconductor layer disposed on the substrate; a tensile strained interlayer layer disposed on the first semiconductor layer; and a second semiconductor layer disposed on the strained interlayer; wherein the difference in strain between the first semiconductor layer and the tensile strained interlayer is about 1 to about 2%.

14 Claims, 10 Drawing Sheets

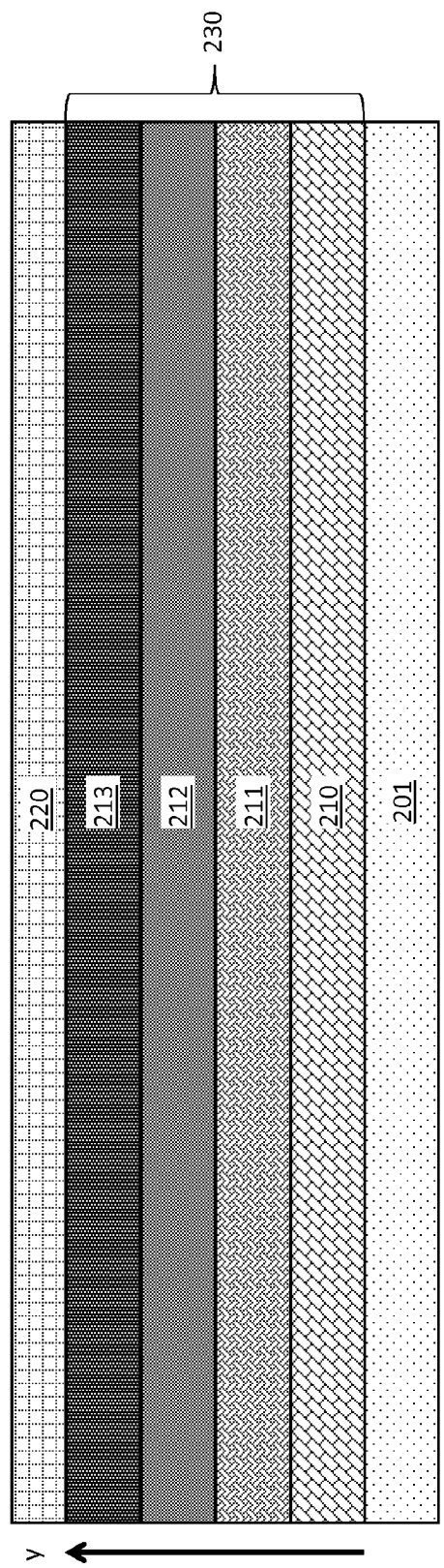

US 9,466,672 B1

REDUCED DEFECT DENSITIES IN GRADED BUFFER LAYERS BY TENSILE STRAINED INTERLAYERS

BACKGROUND

The present invention relates to metal-oxide-semiconductor field-effect transistors (MOSFET), and more specifically, to silicon germanium (SiGe) and germanium (Ge) material layers.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

Using high percentage SiGe or germanium layers as enabling elements in MOSFET devices may improve performance. To work with current complementary metal oxide semiconductor (CMOS) devices, the SiGe and germanium layers may be disposed on a silicon (Si) substrate.

SUMMARY

According to an embodiment, a method of making a semiconductor stack includes disposing a first semiconductor layer on a substrate, the first semiconductor layer including a first atomic % (at. %) of a semiconductor element; disposing a tensile strained interlayer on the first semiconductor layer, the tensile strained interlayer including a second at. % of the semiconductor element, the second at. % being at least 25 at. % smaller than the first at. %; and disposing a second semiconductor layer on the strained interlayer, the second semiconductor layer including a third at. % of the semiconductor element, the third at. % being at least 25 at. % larger than the second at. %.

According to another embodiment, a semiconductor stack includes a substrate; a first semiconductor layer disposed on the substrate; a tensile strained interlayer layer disposed on the first semiconductor layer; and a second semiconductor layer disposed on the strained interlayer; wherein the difference in strain between the first semiconductor layer and the tensile strained interlayer is about 1 to about 2%.

Yet, according to another embodiment, a semiconductor stack includes a substrate; a graded silicon germanium layer disposed on the substrate, the graded silicon germanium layer including an increasing gradient of germanium; a tensile strained interlayer disposed on the graded silicon germanium layer, the tensile strained interlayer including silicon germanium with a germanium content at least 30 atomic % (at. %) smaller than the graded silicon germanium layer; and a silicon germanium layer disposed on the strained interlayer, the silicon germanium layer including a germanium content at least 25 at. % larger than the strained interlayer.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-1C illustrate exemplary methods of making semiconductor devices according to a first embodiment, in which:

FIG. 1A is a cross-sectional side view of a first semiconductor layer disposed on a substrate;

FIG. 1B is a cross-sectional side view after disposing a tensile strained interlayer on the first semiconductor layer;

FIG. 1C is a cross-sectional side view after disposing a second semiconductor layer on the strained interlayer;

FIGS. 2A-2G illustrate exemplary methods of making semiconductor devices according to a second embodiment, in which:

FIG. 2A is a cross-sectional side view after forming a first graded layer on a substrate;

FIG. 2B is a cross-sectional side view after disposing a first interlayer on the graded layer;

FIG. 2C is a cross-sectional side view after disposing a second graded layer on the interlayer;

FIG. 2D is a cross-sectional side view after disposing an interlayer on the second graded layer;

FIG. 2E is a cross-sectional side view after disposing a third graded layer on the interlayer;

FIG. 2F is a cross-sectional side view after disposing an interlayer on the third graded layer; and FIG. 2G is a cross-sectional side view after disposing a fourth graded layer on the interlayer.

DETAILED DESCRIPTION

Figure 1A:
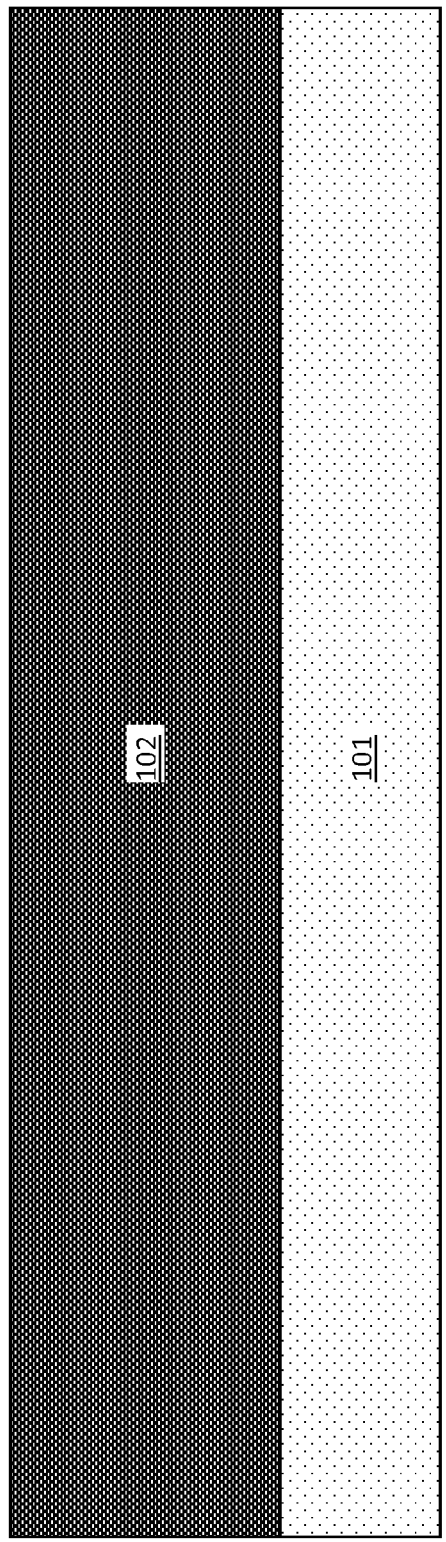

Epitaxially growing SiGe or germanium layers on silicon substrates may lead to high defect densities on the surfaces of the SiGe or germanium layers due to the lattice mismatch between the silicon substrate and the respective SiGe or germanium layers. To reduce defect densities, a graded buffer layer may be used. Graded buffer layers include multiple sequential layers with an increasing proportion of germanium to silicon in the SiGe regions. The proportion of germanium to silicon in the SiGe or the percentage of germanium in the SiGe regions increases until the final desired SiGe proportion is achieved. Another method of reducing defect densities is to grow the final high percentage SiGe or germanium layer as a thick layer on the silicon substrate. However, both approaches may result in relatively high defect densities, e.g., about $1 \times 10^7$ or higher.

Accordingly, described herein is are methods of making semiconductor devices to introduce lower SiGe concentration, and therefore tensily strained, interlayers into the graded buffer layers or the final SiGe layers. The interlayers will "bounce off" the dislocations and prevent propagation towards the surface, thereby reducing the defect density at the surface of the stack.

The lattice mismatch between the SiGe/Ge layer and an underlying layer of Si/SiGe may result in dislocations in the SiGe/Ge layers. The SiGe/Ge layers are also compressively strained because the lattice constant of the SiGe/Ge layer is larger than the underlying layer. The compressive strain may then lead to the formation of dislocation and stacking faults (i.e., additional lattice planes). The stacking faults may propagate to the surface and display a visible crosshatch pattern. However, when a SiGe layer with a lower percentage germanium content is grown on the SiGe layer with a higher germanium content, the lower percentage layer will be tensile strained because the lattice constant of the lower percentage layer is smaller than the underlying SiGe layer. The tensile strain results from "missing" atoms and/or planes, and the additional lattice plane from the compressive layer below will slide in and compensate for the layer with the missing atoms and/or planes. The resulting structure prevents stacking faults, or prevents stacking fault propagation. Optionally, an anneal process may be used to move dislocations. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 1B:
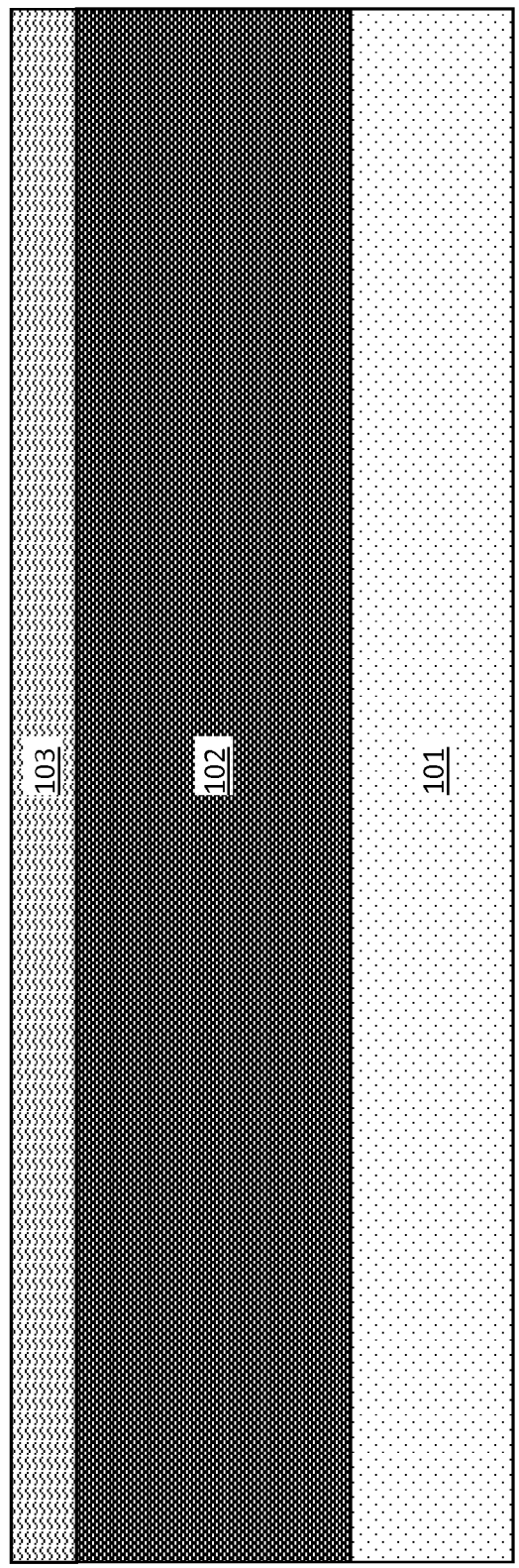
Figure 1C:
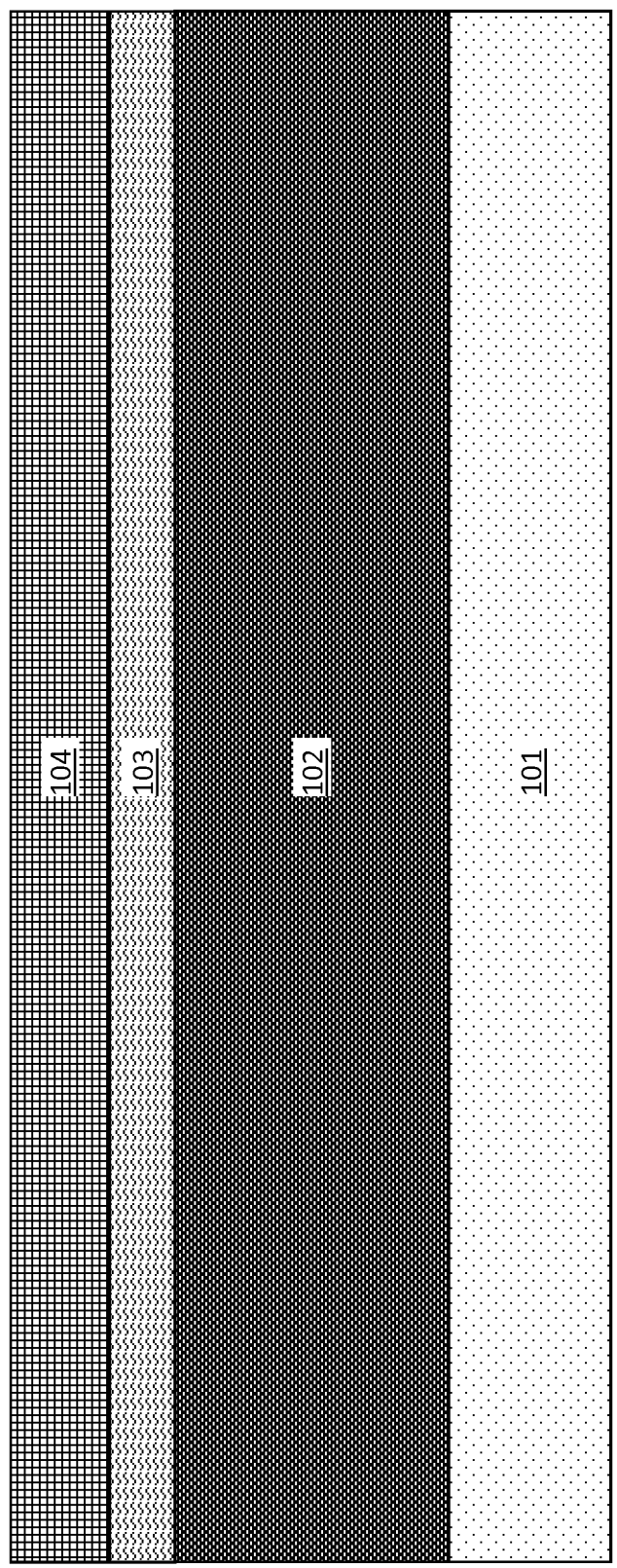

Turning now to the Figures, FIGS. 1A-1C illustrate exemplary methods of making semiconductor stacks and devices according to a first embodiment. FIG. 1A is a cross-sectional side view of a first semiconductor layer 102 disposed on a substrate 101.

The substrate 101 includes one or more semiconductor materials. In one embodiment, the substrate 101 is silicon. Other non-limiting examples of substrate 101 materials include germanium (germanium), SiGe (silicon germanium), silicon alloys, germanium alloys, GaAs (gallium arsenide), InAs (indium arsenide), InP (indium phosphide), or any combination thereof. Other examples of suitable substrates include silicon-on-insulator (SOI) substrates with buried oxide (BOX) layers.

The thickness of the substrate 101 generally varies is not intended to be limited. In one aspect, the thickness of the substrate 101 is in a range from about 300 to about 1500 micrometers. In another aspect, the thickness of the substrate 101 is in a range from about 500 to about 1000 micrometers.

The first semiconductor layer 102 includes one or more semiconductor materials that are different than the substrate 101. The first semiconductor layer 102 is a semiconductor material comprising a first atomic % (at. %) of a semiconductor element. The semiconductor element may be, for example, germanium, a "group III element," such as aluminum (Al), boron (B), gallium (Ga), or indium (In), or a "group V element," such as nitrogen (N), phosphorous (P), arsenic (As), antimony (Sb), or bismuth (Bi).

In one embodiment, the first semiconductor layer 102 includes SiGe with a germanium content of at least 40 atomic % (at. %). In some embodiments, the SiGe includes a germanium content in a range from about 70 to about 99 at. %. Yet, in other embodiments, the SiGe includes a germanium content in a range from about 40 to about 85 at. %. Yet, in other embodiments, the SiGe includes a germanium content about or in any range from about 40, 45, 50, 55, 60, 65, 70, 75, 80, 85, and 90 at. %.

Other non-limiting examples of semiconductor materials for the first semiconductor layer 102 include germanium, germanium alloys, and III-V materials, for example, indium phosphide (InP), gallium arsenide (GaAs), aluminum arsenide (AlAs), indium gallium arsenide (InGaAs) or any combination thereof. The III-V materials may include at least one "group III element," such as aluminum (Al), boron (B), gallium (Ga), indium (In), and at least one "group V element," such as nitrogen (N), phosphorous (P), arsenic (As), antimony (Sb), or bismuth (Bi). When the first semiconductor layer 102 is a III-V material, the content of any of the group III element or group V element may generally vary.

The first semiconductor layer 102 may be formed using an epitaxial growth process to grow a crystalline layer onto a crystalline substrate 101 beneath. The underlying substrate 101 acts as a seed crystal. The epitaxial layers may be grown from gaseous or liquid precursors. The epitaxial growth may be formed using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The epitaxial growth may be doped during deposition by adding a dopant or impurity.

The first semiconductor layer 102 is relatively thick. In some embodiments, the first semiconductor layer 102 has a thickness in a range from about 1 to about 5 microns. In other embodiments, the first semiconductor layer 102 has a thickness in a range from about 2 to about 4 microns. Yet, in other embodiments, the first semiconductor layer 102 has a thickness about or in any range from about 1, 2, 3, 4, and 5 microns.

The first semiconductor layer 102 may be about 90 to about 100% relaxed. To ensure that the first semiconductor layer 102 is sufficiently relaxed, the first semiconductor layer 102 is grown to a thickness that is thicker than the critical thickness, e.g., at least twice the critical thickness, or 2 to 10 times thicker than the critical thickness. Such thickness ensures that the first semiconductor layer 102 relaxes.

Critical thickness is the the thickness at which a strained layer relaxes. For example, a thin strained layer does not have sufficient energy to inherently relax and thus needs external factors to relax. However, the thicker the strained layer, the more energy it has to relax. Once the energy is enough to form crystal defects (e.g., dislocations or stacking faults), the layer relaxes. When the layer relaxes, it assumes its natural lattice constant and loses the strain it had before. Relaxation is a gradual process. When a layer is, for example, 100% relaxed, the layer has a lattice constant that is a natural lattice constant, without strain.

Lattice mismatch should also be taken into account because the greater the lattice mismatch, the easier the first semiconductor layer 102 relaxes, and thickness plays less of a role in relaxation. Relaxation may be determined using x-ray diffraction (SRD) to obtain lattice constants of the first semiconductor layer 102. For example, when the first semiconductor layer 102 is SiGe, the lattice constant should be that of unstrained SiGe provided the germanium content. The lattice constant of SiGe may be determined using the following formula for $Si_{1-x}Ge_x$: $5.431+0.20x+0.027x^2$) Å, wherein the lattice constant units are recited in Angstrom (see, for example, Dismukes, J. P., L. Ekstrom, R. J. Pfaff, J. Phys. Chem. 68, 1964, 3021. (a)). The lattice constant of the formed semiconductor layer 102 should be within 10% of the unstrained/relaxed value.

FIG. 1B is a cross-sectional side view after disposing a tensile strained interlayer 103 on the first semiconductor layer 102. The tensile strained interlayer 103 is thinner than the first semiconductor layer 102 and fully tensile strained. The tensile strained interlayer 103 is fully tensile strained because it has a thickness below the critical thickness. In some embodiments, the critical thickness of the tensile strained interlayer 103 depends on the absolute value of the difference in germanium content when the first semiconductor layer 102 and tensile strained interlayer 103 are SiGe.

In some embodiments, the tensile strained interlayer 103 has a thickness in a range from about 20 to about 100 nanometers (nm). In other embodiments, the tensile strained interlayer 103 has a thickness in a range from about 30 to about 40 nm. Yet, in other embodiments, the tensile strained interlayer 103 has a thickness about or in any range from about 20, 25, 30, 35, 40, 45, 50, 60, 70, 80, 90, and 100 nm.

The tensile strained interlayer 103 includes one or more semiconductor materials described above for the first semiconductor layer 102. The tensile strained interlayer 103 may be formed from and include the same materials or different materials than the first semiconductor layer 102.

In some embodiments, the tensile strained interlayer 103 includes a second at. % of a semiconductor element. The second at. % is at least 25 at. % smaller than the first at. % of the first semiconductor layer 102. In other embodiments, the tensile strained interlayer includes, for example, a III-V material.

In one embodiment, the tensile strained interlayer 103 includes SiGe with a germanium content less than the first semiconductor layer 102 of SiGe. In another embodiment, the first semiconductor layer 102 is SiGe, the tensile strained interlayer 103 is SiGe, and the first semiconductor layer 102 and the tensile strained interlayer 103 have at least a 25 at. % difference in germanium content; the first semiconductor layer 102 has a higher germanium content than the tensile strained interlayer 103. When the first semiconductor layer 102 and tensile strained interlayer 103 are SiGe, the difference in germanium content may be from about 30 to about 60 at. %.

In the above exemplary embodiment, because the tensile strained interlayer 103 has a lower germanium content than the first semiconductor layer 102, the tensile strained interlayer 103 is less strained than the first semiconductor layer 102. In another exemplary embodiment, the first semiconductor layer 102 is SiGe with a germanium content of about 85 at. %, and the tensile strained interlayer 103 is SiGe with a germanium content of about 50 at. %. The first semiconductor layer 102 has a strain of about 3.7%, and the tensile strained interlayer 103 has a strain of about 2%. The difference in strain between the first semiconductor layer 102 and the tensile strained interlayer in this example is about 1.7%. The % strain can be measured using high resolution x-ray diffractometry to determine the lattice constants from which the strain can be calculated.

In the above exemplary embodiments, the first semiconductor layer 102 has a strain in a range from about 3 to about 4%. The tensile strained interlayer 103 has a strain in a range from about 1 to about 2%. The difference in strain between the first semiconductor layer 102 and tensile strained interlayer 103 is in a range from about 1 to about 2%.

Yet, in other embodiments, the first semiconductor layer 102 and the tensile strained interlayer include different semiconductor materials, for example, III-V materials. The difference in % strain between the first semiconductor layer 102 and the tensile strained interlayer 103 is in a range from about 1 to about 2%.

In one embodiment, the tensile strained interlayer 103 is SiGe and includes a germanium content of about 20 to about 60 at. %. In some embodiments, the tensile strained interlayer 103 is SiGe and includes a germanium content in a range from about 20 to about 60 at. %. Yet, in other embodiments, the tensile strained interlayer 103 is SiGe and includes a germanium content about or in any range from about 20, 25, 30, 35, 40, 45, 50, 55, and 60 at. %.

FIG. 1C is a cross-sectional side view after disposing a second semiconductor layer 104 on the tensile strained interlayer 103. The second semiconductor layer 104 may include one or more same or different semiconductor materials than the tensile strained interlayer 103.

The second semiconductor layer 104 may include a semiconductor material with a third at. % of a semiconductor element. The third at. % is at least 25 at. % larger than the second at. %. Semiconductor materials and elements are described above for first semiconductor layer 102.

In some embodiments, the second semiconductor layer 104 has a thickness in a range from about 1 to about 5 microns. In other embodiments, the second semiconductor layer 104 has a thickness in a range from about 2 to about 4 microns. Yet, in other embodiments, the second semiconductor layer 104 has a thickness about or in any range from about 1, 2, 3, 4, and 5 microns.

In one embodiment, the second semiconductor layer 104 is SiGe with a germanium content that is higher than the tensile strained interlayer 103. The second semiconductor layer 104 may be SiGe with the same germanium content as the first semiconductor layer 102. The second semiconductor layer 104 may be SiGe with a germanium content of at least 40 atomic % (at. %). Yet, in other embodiments, the SiGe includes a germanium content in a range from about 40 to about 85 at. %. Yet, in other embodiments, the SiGe includes a germanium content about or in any range from about 40, 45, 50, 55, 60, 65, 70, 75, 80, 85, and 90 at. %.

The above second semiconductor layer 104 disposed on the tensile strained interlayer 103 are lattice mismatched semiconductor layers. In exemplary embodiments, tensile strained interlayer 103 and second semiconductor layer 104 include SiGe as described above. Although, it is to be noted that these layers, nor first semiconductor layer 102, are limited to SiGe and may include any of one or more semiconductor materials/elements. In some embodiments, the third semiconductor layer 104 includes a III-V material, and the difference in strain between the tensile strained interlayer 103 and the third semiconductor layer 104 is at least 1%, or about 1 to about 2%.

FIGS. 2A-2G illustrate exemplary methods of making semiconductor stacks and devices according to a second embodiment. The second embodiment incorporates one or more interlayers (for example, first, second, and third interlayers 220, 221, 222) within a graded layer of of increasing concentration. The difference in strain between the graded layers and the adjacent interlayers is at least 1%.

Figure 2A:
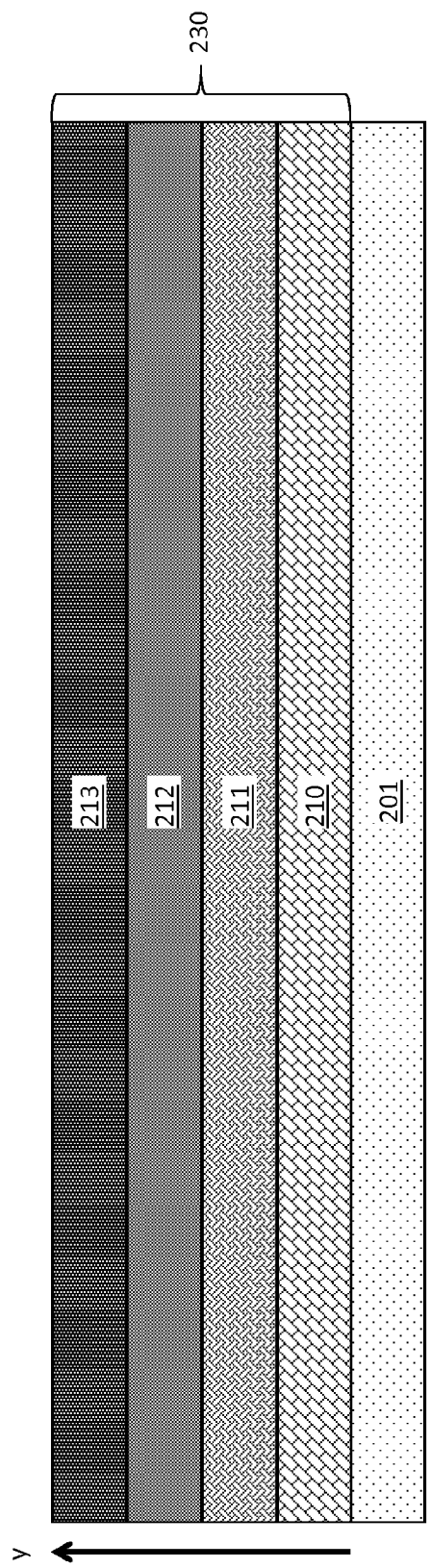

FIG. 2A is a cross-sectional side view after forming a first graded layer 230 on a substrate 201. The first graded layer 230 includes one or more semiconductor materials. The first graded layer 230 may include multiple layers with an increasing atomic gradient of at least one semiconductor element in the y-axis direction. The first graded layer 230 may include, for example, SiGe or a III-V material. When the graded layer 230 includes SiGe, the gradient is an increasing atomic gradient of Ge. When the graded layer 230 includes a III-V material, the gradient may a group III element (e.g., Al, B, Ga, or In) or a group V element (e.g., N, P, As, or Sb).

The increasing atomic gradient may be a linear gradient or a step-wise gradient of discrete graded layers. For example, the increasing atomic gradient may be a steady linear atomic gradient from 0 to about a desired upper at. % limit of a semiconductor element. In other embodiments, the first graded layer 230 includes step-wise discrete layers with increasing amounts of a semiconductor element.

In the exemplary embodiment shown in FIG. 2A, the first graded layer 230 contacts the substrate and includes a first layer 210, a second layer 211, a third layer 212, and a fourth layer 213. First, second, third, and fourth layers 210, 211, 212, 213 have increasing contents of a semiconductor element. For example, the first layer 210 may be SiGe with a germanium content of about 20 at. %. The second layer 211 may be SiGe with a germanium content of about 30 at. %. The third layer 212 may be SiGe with a germanium content of about 40 at. %. The fourth layer 213 may be SiGe with a germanium content of about 50 at. %.

In some embodiments, first graded layer 230 is SiGe with an increasing atomic step-wise gradient from about 0 to about 50 at. % Ge. In other embodiments, first graded layer 230 is SiGe with an increasing atomic gradient from about 20 to about 50 at. % Ge. Yet, in other embodiments, first graded layer 230 is SiGe with an increasing atomic gradient from about 0 to about 70 at. %. Still yet, in other embodiments, first graded layer 230 is SiGe with an increasing atomic gradient in any range from about 1, 10, 20, 30, 40, 50, 60, and 70 at. % Ge. The gradients may include larger or smaller discrete layers or gradients.

When the first graded layer 230 includes discrete layers of increasing concentrations, as shown in FIG. 2A, the individual layers (first, second, third, and fourth layers 210, 211, 212, 213) are relatively thick. First, second, third, and fourth layers 210, 211, 212, 213 each have thicknesses in a range from about 1 to about 5 microns. In other embodiments, first, second, third, and fourth layers 210, 211, 212, 213 have thicknesses in a range from about 2 to about 4 microns. The total thickness of the first graded layer 230 depends on the number of discrete layers and the range of atomic gradient. The first graded layer 230 is about 90 to about 100% relaxed.

FIG. 2B is a cross-sectional side view after disposing a first interlayer 220 on the first graded layer 230. The first tensile strained interlayer 220 is fully tensile strained. First interlayer 220 is thinner than each of first, second, third, and fourth layers 210, 211, 212, 213 of the first graded layer 230. In some embodiments, first interlayer 220 has a thickness in a range from about 20 to about 50 nm. In other embodiments, the first interlayer 220 has a thickness in a range from about 30 to about 40 nm. Yet, in other embodiments, first interlayer 220 has a thickness about or in any range from about 20, 25, 30, 35, 40, 45, 50, 60, 70, 80, 90, and 100 nm.

First interlayer 220 includes one or more semiconductor materials. First interlayer 220 includes a semiconductor material with a semiconductor element content that is at least 25 at. % smaller than the first graded layer 230. When the first interlayer 220 includes SiGe, the germanium content is less than first graded layer 230. For example, first interlayer 220 may include from about 10 to about 50 at. % Ge. In another embodiment, first interlayer 220 may include a germanium content about or in any range from about 10, 15, 20, 25, 30, 35, 40, 45, and 50 at. %.

Figure 2C:
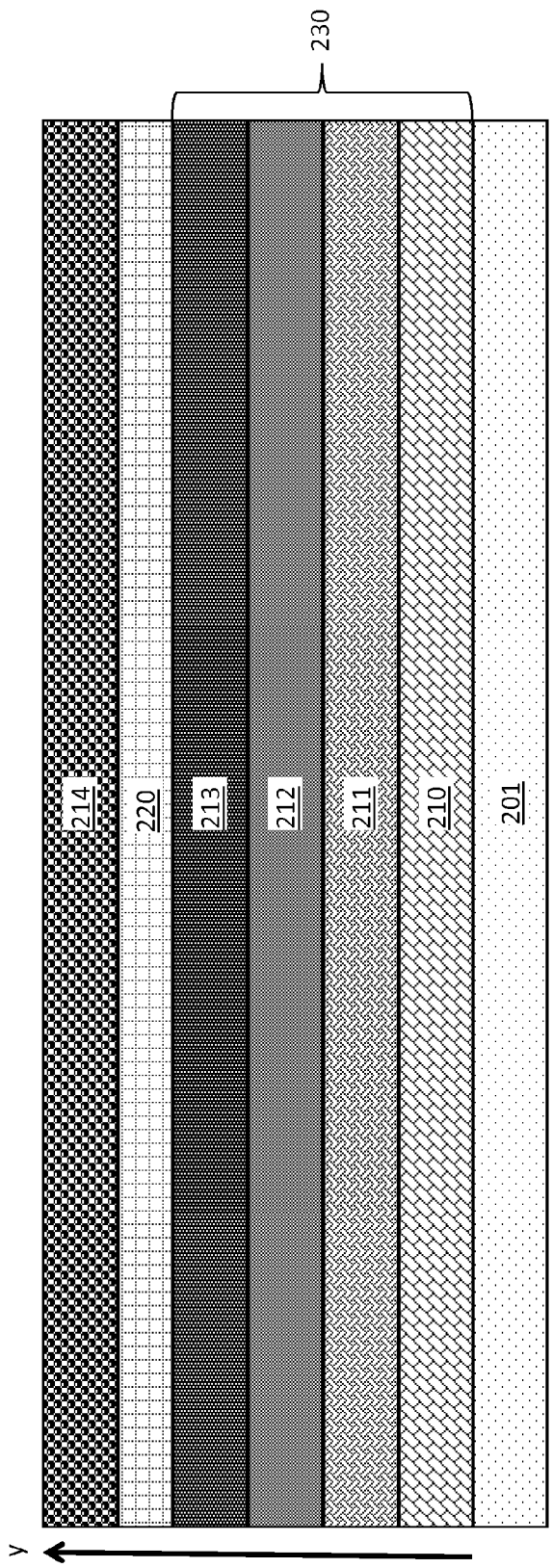

FIG. 2C is a cross-sectional side view after disposing a second graded layer 214 on the first interlayer 220. The second graded layer 214 is 90-100% relaxed. The second graded layer 214 extends the increasing atomic gradient from the first graded layer 230 in the y-axis direction. The second graded layer 214 includes a higher content of a semiconductor element, for example, Ge, than the first graded layer 230. For example, when first graded layer 230 includes a gradient of 20 to 50 at. % Ge, second graded layer 214 may include, for example, 60 at. % Ge. The second gradient layer 214 may be the final layer or include other additional alternating interlayers and graded layers. In some embodiments, second graded layer 214 include from about 60 to about 85 at. % of a semiconductor element. The second graded layer 214 has a thickness in a range from about 1 to about 5 microns.

Figure 2D:
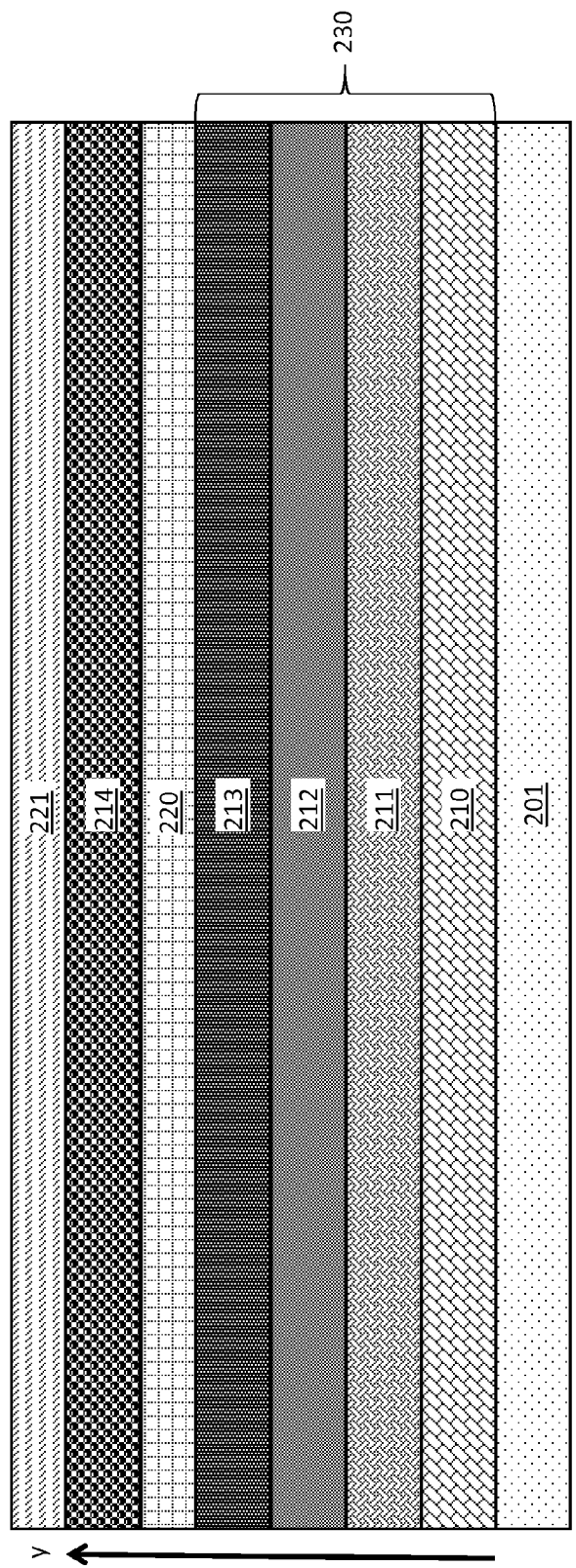

FIG. 2D is a cross-sectional side view after disposing a second interlayer 221 on the second graded layer 214. The second interlayer 221 is also fully tensile strained and has a thickness as described above for first interlayer 220.

Second interlayer 221 includes one or more semiconductor materials. The second interlayer 221 includes at least 25 at. % less of a semiconductor element than second graded layer 214. When the second interlayer 221 includes SiGe, the germanium content is less than second graded layer 214 and higher than first interlayer 220. For example, second interlayer 221 may include from about 20 to about 50 at. % Ge. In another embodiment, second interlayer 221 may include a germanium content about or in any range from about 20, 25, 30, 35, 40, 45, and 50 at. %.

Figure 2E:
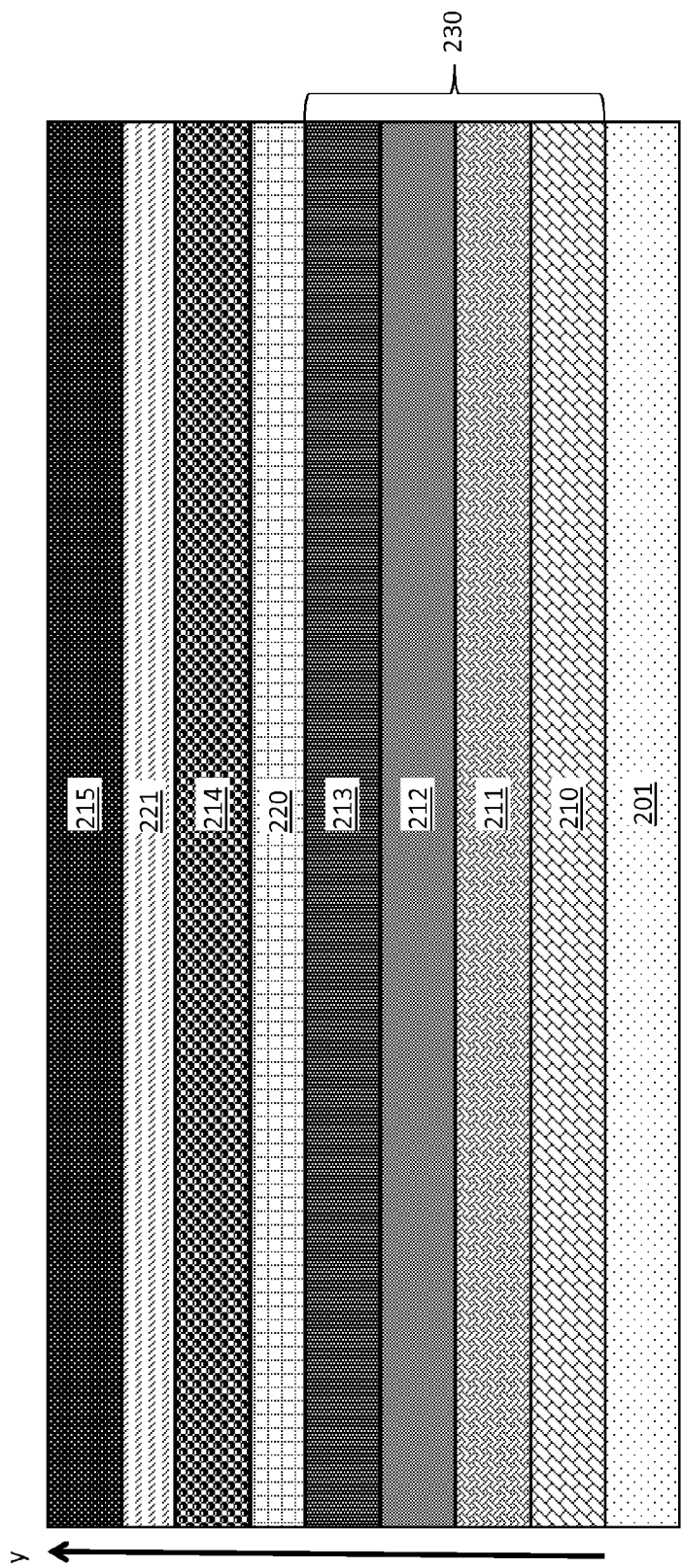

FIG. 2E is a cross-sectional side view after disposing a third graded layer 215 on the second interlayer 221. The third graded layer 215 extends the increasing atomic gradient from the first and second graded layers 230, 214 in the y-axis direction.

The third graded layer 215 includes a higher content of a semiconductor element, for example, Ge, than the second graded layer 214 (and the second interlayer 221). The third graded layer 215 includes at least 25 at. % more of a semiconductor element than second interlayer 221.

For example, when second graded layer 214 includes 60 at. % Ge, third graded layer 215 may include, for example, 70 at. % Ge. The third graded layer 215 may be the final layer or include other additional alternating interlayers and graded layers. The third graded layer 215 may have thicknesses as described for any of first, second, third, or fourth layers 210, 211, 212, 213.

Figure 2F:
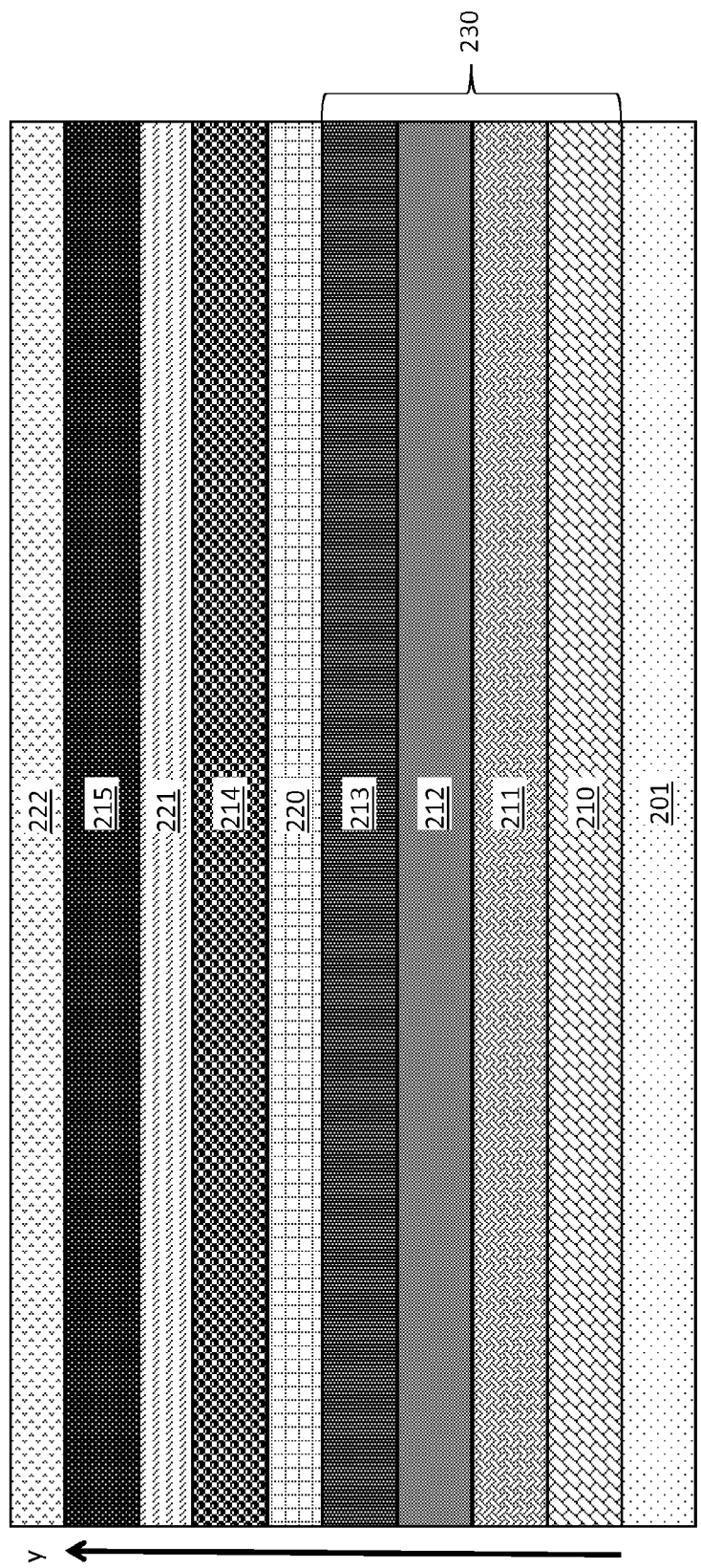

FIG. 2F is a cross-sectional side view after disposing a third interlayer 222 on the third graded layer 215. The third interlayer 222 is also fully tensile strained and has a thickness as described above for first interlayer 220. The interlayers (first, second, and third interlayers 220, 221, 222) increase in content of at least one element. The interlayers, however, include a lower corresponding content than the graded layers disposed on either side of the interlayers. The difference in content of a semiconductor element between any graded layer and interlayer is at least 30 at. %.

Third interlayer 222 includes one or more semiconductor materials. When the third interlayer 222 includes SiGe, the germanium content is less than third graded layer 215 and higher than second interlayer 221. For example, third interlayer 222 may include from about 30 to about 50 at. % Ge. In another embodiment, third interlayer 222 may include a germanium content about or in any range from about 30, 35, 40, 45, and 50 at. %.

Figure 2G:
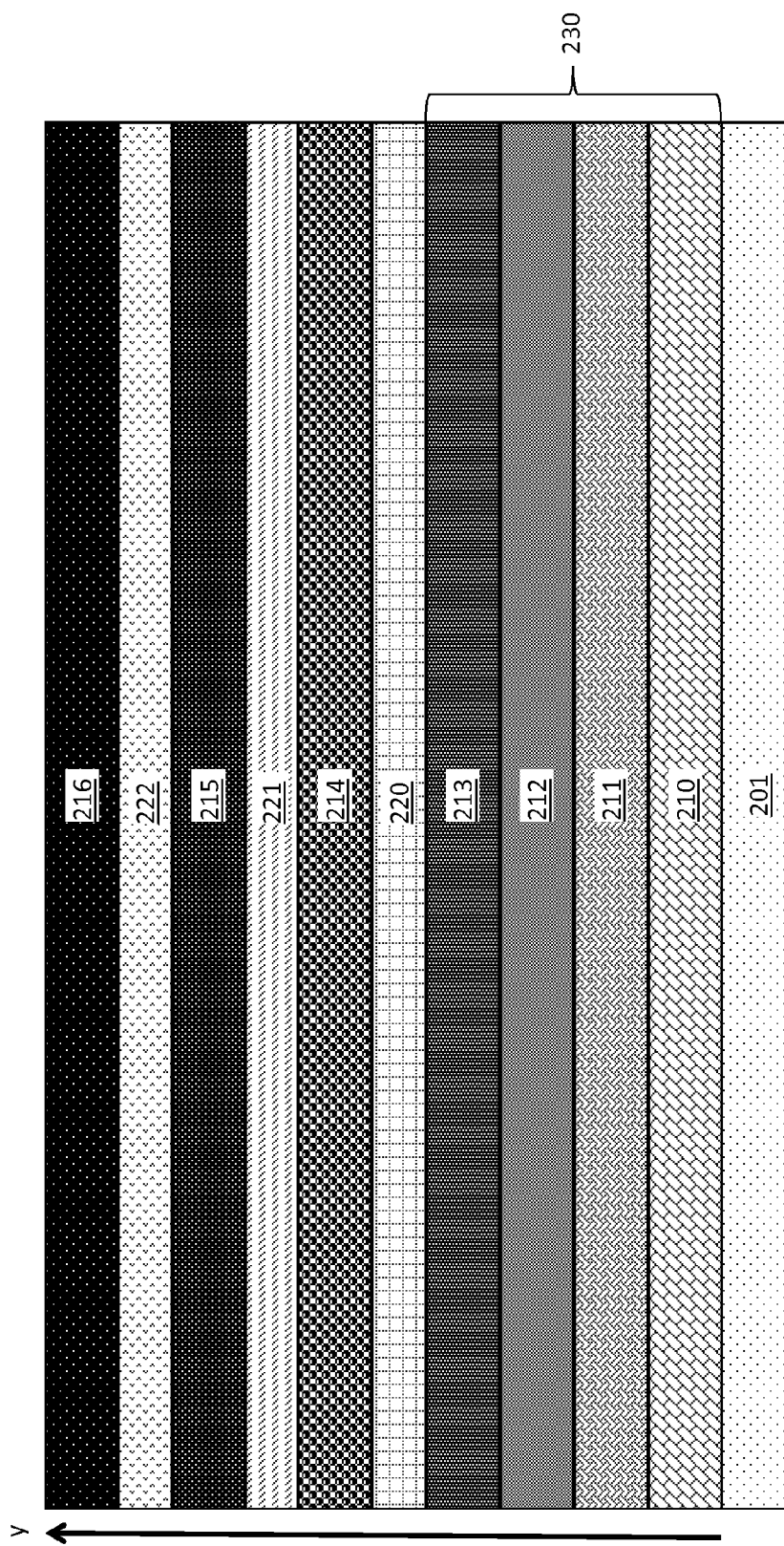

FIG. 2G is a cross-sectional side view after disposing a fourth graded layer 216 on the third interlayer 222. The fourth graded layer 216 extends the increasing atomic gradient from the first, second, and third graded layers 230, 214, 215 in the y-axis direction.

The fourth graded layer 216 includes a higher content of a semiconductor element, for example, Ge, than the third graded layer 215 (and the third interlayer 222). For example, when third graded layer 215 includes 70 at. % Ge, fourth graded layer 216 may include, for example, 85 at. % Ge. The fourth graded layer 216 may be the final layer or include other additional alternating interlayers and graded layers. The fourth graded layer 216 may have thicknesses as described for any of first, second, third, or fourth layers 210, 211, 212, 213.

Although the semiconductor stack shown in FIG. 2G includes three strained interlayers (first, second, and third interlayers 220, 221, 222) disposed between graded layers (first, second, third, and fourth graded layers 230, 214, 215, 216), semiconductor stacks may include any number of interlayers and graded layers. For example, one interlayer may be disposed between graded layers, or two or more interlayers may be disposed between graded layers.

As described above, various embodiments described are methods of making semiconductor devices to introduce lower SiGe concentration, and therefore tensile strained, interlayers into the graded buffer layers or the final SiGe layers. The interlayers will "bounce off" the dislocations and prevent propagation towards the surface, thereby reducing the defect density at the surface.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor stack, the method comprising: disposing a first semiconductor layer directly on a silicon substrate, the first semiconductor layer comprising a first atomic % (at. %) of a semiconductor element, having a thickness in a range from 1 to 5 microns and being 90 to 100% relaxed;
   disposing a tensile strained interlayer on the first semiconductor layer, the tensile strained interlayer comprising a second at. % of the semiconductor element and having a thickness in a range from 20 to 50 nanometers, the second at. % being at least 25 at. % smaller than the first at. %;
   disposing a second semiconductor layer on the tensile strained interlayer, the second semiconductor layer comprising a third at. % of the semiconductor element and having a thickness in a range from 1 to 5 microns and being 90 to 100% relaxed, and the third at. % being at least 25 at. % larger than the second at. %; and
   wherein the first semiconductor layer, the tensile strained interlayer, and the second semiconductor layer comprise silicon germanium (SiGe), and the semiconductor element is germanium (Ge).

2. The method of claim 1, further comprising disposing a graded silicon germanium layer and a second tensile strained interlayer on the substrate before disposing the first semiconductor layer on the substrate, the graded silicon germanium layer contacting the substrate and comprising an increasing gradient of germanium, the second tensile strained interlayer being disposed on the graded silicon germanium layer, and the first semiconductor layer being disposed on the second tensile strained interlayer.

3. The method of claim 2, wherein the increasing gradient of germanium of the graded silicon germanium layer is in a range from 20 to 50 atomic % (at. %).

4. The method of claim 1, wherein the first atomic % (at. %) is in a range from 40 to 85 at. %.

5. The method of claim 1, wherein the second at. % is in a range from 20 to 60 at. %.

6. The method of claim 1, wherein the tensile strained interlayer is fully tensile strained.

7. A semiconductor stack, comprising:
a silicon substrate;
a first semiconductor layer disposed directly on the silicon substrate, the first semiconductor layer having a thickness in a range from 1 to 5 microns and being 90 to 100% relaxed;
a tensile strained interlayer layer disposed on the first semiconductor layer, the tensile strained interlayer having a thickness in a range from 20 to 100 nanometers;
a second semiconductor layer disposed on the strained interlayer, the second semiconductor layer having a thickness in a range from 1 to 5 microns and being 90 to 100% relaxed;
wherein the difference in strain between the first semiconductor layer and the tensile strained interlayer is 1 to 2%; and
wherein the first semiconductor layer, the tensile strained interlayer, and the second semiconductor layer comprise silicon germanium (SiGe), and the semiconductor element is germanium (Ge).

8. The semiconductor stack of claim 7, wherein the first semiconductor layer and the second semiconductor layer are III-V materials.

9. A semiconductor stack, comprising:
a substrate;
a graded silicon germanium layer disposed on the substrate, the graded silicon germanium layer comprising an increasing gradient of germanium;
a tensile strained interlayer disposed on the graded silicon germanium layer, the tensile strained interlayer comprising silicon germanium with a germanium content at least 30 atomic % (at. %) smaller than the graded silicon germanium layer and having a thickness in a range from 20 to 50 nanometers; and
a silicon germanium layer disposed on the tensile strained interlayer, the silicon germanium layer comprising a germanium content at least 25 at. % larger than the strained interlayer, having a thickness in a range from 1 to 5 microns, and being 90 to 100% relaxed.

10. The semiconductor stack of claim 9, wherein the increasing gradient of germanium of the graded silicon germanium layer is in a range from 20 to 50 atomic % (at. %).

11. The semiconductor stack of claim 9, further comprising a second tensile strained interlayer disposed on the silicon germanium layer and having a germanium content at least 30 atomic % (at. %) smaller than the silicon germanium layer, and a second silicon germanium layer disposed on the second tensile strained interlayer and having a germanium content at least 25 at. % larger than the second tensile strained interlayer.

12. The semiconductor stack of claim 11, further comprising a third tensile strained interlayer disposed on the second silicon germanium layer and having a germanium content at least 25 atomic % (at. %) smaller than the second silicon germanium layer, and a third silicon germanium layer disposed on the third tensile strained interlayer and having a germanium content at least 25 at. % larger than the third strained interlayer.

13. The semiconductor stack of claim 9, wherein the tensile strained interlayer has a thickness in a range from 20 to 100 nanometers (nm).

14. The method of claim 1, wherein the thickness of the first semiconductor layer and the thickness of the second semiconductor layer are each at least twice the critical thickness to provide 90 to 100% relaxation.

* * * * *